United States Patent
Li et al.

(10) Patent No.: US 10,324,371 B2
(45) Date of Patent: Jun. 18, 2019

(54) SYSTEM AND METHOD FOR GENERATING MASK PATTERN AND EXPOSURE SYSTEM

(71) Applicant: BOE Technology Group Co., Ltd., Beijing (CN)

(72) Inventors: Tailiang Li, Beijing (CN); Junmin Sun, Beijing (CN); Hongli Ding, Beijing (CN); Hongtao Guan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 153 days.

(21) Appl. No.: 15/501,497

(22) PCT Filed: May 6, 2016

(86) PCT No.: PCT/CN2016/081258
§ 371 (c)(1),
(2) Date: Feb. 3, 2017

(87) PCT Pub. No.: WO2017/156842
PCT Pub. Date: Sep. 21, 2017

(65) Prior Publication Data
US 2018/0088460 A1 Mar. 29, 2018

(30) Foreign Application Priority Data
Mar. 18, 2016 (CN) .......................... 2016 1 0158206

(51) Int. Cl.
G06F 17/50 (2006.01)
G03F 1/76 (2012.01)
G03F 7/20 (2006.01)

(52) U.S. Cl.
CPC .................. *G03F 1/76* (2013.01); *G03F 7/20* (2013.01); *G03F 7/2051* (2013.01); *G03F 7/70525* (2013.01)

(58) Field of Classification Search
CPC ............. G06K 7/0008; G06K 19/0723; G06K 19/07749; G06K 19/0701; G06K 7/10257;
(Continued)

(56) References Cited

U.S. PATENT DOCUMENTS

| 6,251,550 | B1 * | 6/2001 | Ishikawa | G03F 7/2051 |
| | | | | 430/22 |
| 6,702,287 | B1 * | 3/2004 | Pendexter | A63F 3/02 |
| | | | | 273/261 |

(Continued)

FOREIGN PATENT DOCUMENTS

| CN | 101770588 A | 7/2010 |
| CN | 101556436 B | 3/2011 |

(Continued)

OTHER PUBLICATIONS

International Search Report and Written Opinion of International Application No. PCT/CN2016/081258, dated Jun. 30, 2016, 12 pages.

(Continued)

*Primary Examiner* — Nghia M Doan
(74) *Attorney, Agent, or Firm* — Westman, Champlin & Koehler, P.A.

(57) ABSTRACT

The present disclosure provides a system for generating a mask pattern, a method for generating a mask pattern, and an exposure system. According to an embodiment of the present disclosure, the system for generating a mask pattern comprises: a mask pattern provision device configured to provide a mask pattern signal via a wired or wireless network; a mask pattern transmission device configured to process the mask pattern signal provided by the mask pattern provision device to generate mask pattern information, and to transmit the generated mask pattern information over a Radio Frequency Identification (RFID) signal; and a mask (Continued)

pattern generation device configured to generate a mask pattern corresponding to the mask pattern information based on the mask pattern information and display the generated mask pattern. The embodiments of the present disclosure allow interaction between the mask pattern provision device and the mask pattern generation device by utilizing IoT technique, such that the mask pattern generation device can display various different mask patterns on an e-ink screen, thereby providing a fast, convenient and low cost exposure scheme.

11 Claims, 4 Drawing Sheets

(58) Field of Classification Search
CPC . G06K 7/10336; G06F 17/5081; G06F 21/36; G06F 21/62; G06F 21/6218; G06F 21/84; G06F 17/212; G06F 17/5068; G06F 3/048; G06F 8/38; G03F 1/70; G03F 1/36; G03F 1/76; G03F 7/70483
USPC .................................. 716/50–55; 430/5, 30
See application file for complete search history.

(56) References Cited

U.S. PATENT DOCUMENTS

| | | | |
|---|---|---|---|
| 7,657,865 B2* | 2/2010 | Yamazoe | G03F 7/70425 |
| | | | 716/54 |
| 8,571,845 B2 | 10/2013 | Cao et al. | |
| 8,806,387 B2 | 8/2014 | Cao et al. | |
| 8,874,423 B2 | 10/2014 | Cao et al. | |
| 2008/0121939 A1* | 5/2008 | Murray | G03F 1/36 |
| | | | 257/202 |
| 2012/0107730 A1 | 5/2012 | Ishii et al. | |
| 2012/0113399 A1 | 5/2012 | Yeom et al. | |
| 2014/0325678 A1* | 10/2014 | Kotla | G06F 21/62 |
| | | | 726/28 |

FOREIGN PATENT DOCUMENTS

| | | |
|---|---|---|
| CN | 102057329 A | 5/2011 |
| CN | 102592002 A | 7/2012 |
| CN | 102930826 A | 2/2013 |
| CN | 104224106 A | 12/2014 |
| CN | 104581059 A | 4/2015 |

OTHER PUBLICATIONS

English translation of Box No. V of the Written Opinion for the International Searching Authority for International Application No. PCT/CN2016/081258, 2 pages.

Non-patent literature document in International Search Report for International Application No. PCT/CN2016/081258, "Sensing Detection Technology", dated Jul. 31, 2011, pp. 315-319.

First Office Action, including Search Report, for Chinese Patent Application No. 201610158206.6, dated Mar. 29, 2019, 18 pages.

* cited by examiner

SYSTEM AND METHOD FOR GENERATING MASK PATTERN AND EXPOSURE SYSTEM

The present application is a Section 371 National Stage application of PCT/CN2016/081258, filed on May 6, 2016, which has not yet published, entitled "SYSTEM AND METHOD FOR GENERATING MASK PATTERN AND EXPOSURE SYSTEM", and claims priority to Chinese Patent Application No. 201610158206.6, filed on Mar. 18, 2016, which are incorporated herein by reference in their entirety.

TECHNICAL FIELD

The present disclosure relates to mask exposure, and more particularly, to a system for generating a mask pattern, a method for generating a mask pattern, and an exposure system.

BACKGROUND

Currently, in a production line of glass substrates, glass substrates having different patterns are mainly produced by using different masks for exposure. That is, when a gate layer is exposed, a mask corresponding to the gate layer needs to be used. When several layers are exposed, masks corresponding to the respective layers need to be used. The same layer of different products may have different masks due to different designs. Hence, the exposure system is required to store a large number of masks and it takes a long time for engineers to confirm the masks each time they are used for production. Meanwhile, during production, the exposure system needs to retrieve different masks frequently, which causes a great waste in labor, power and time.

With development of communication technologies, Internet of Things (IoT) has become an important component of the new generation information technology, which is also a critical development phase in the "information" era. The IoT connects anything with Internet for information exchange and communication in accordance with a defined protocol via information sensing devices such as Radio Frequency Identification (RFID), infrared sensor, Global Positioning System (GPS), so as to achieve intelligent identification, positioning, tracking, monitoring and management.

Therefore, it becomes a technical problem to be solved regarding how to provide exchange between a local PC or a mobile device and a mask pattern generation device in a field device (i.e., exposure system) via a network or a cloud (i.e., IoT technique), thereby allowing reading/writing of mask information from/to the field device.

SUMMARY

In light of above, the embodiments of the present disclosure provide a system for generating a mask pattern and a method for generating a mask pattern, capable of solving the problem that a mask pattern generation device in an exposure system needs to store a large number of mask patterns, it takes a long time for engineers to confirm the masks each time they are used for production, and during production, the exposure system needs to retrieve different masks frequently, which causes a great waste in labor, power and time.

According to an aspect of the present disclosure, a system for generating a mask pattern is provided. The system comprises: a mask pattern provision device configured to provide a mask pattern signal via a wired or wireless network; a mask pattern transmission device configured to process the mask pattern signal provided by the mask pattern provision device to generate mask pattern information, and to transmit the generated mask pattern information over a Radio Frequency Identification (RFID) signal; and a mask pattern generation device configured to generate a mask pattern corresponding to the mask pattern information based on the mask pattern information and display the generated mask pattern.

Preferably, the mask pattern provision device is a local Personal Computer (PC) or a mobile device.

Preferably, the wired network is at least one of Internet, a Local Area Network (LAN), a Wide Area Network (WAN) and a telecommunication network.

Preferably, the wireless network is at least one of 3G network, 4G network, Long Term Evolution (LTE) network, Wi-Fi network, Bluetooth network and Near Field Communication (NFC) network.

Preferably, the mask pattern transmission device comprises: a cloud and/or gateway configured to process the mask pattern signal provided by the mask pattern provision device; and an RFID controller configured to transmit the RFID signal to the mask pattern generation device, so as to supply power and transmit the mask pattern information to the mask pattern generation device.

Preferably, the RFID signal comprises the mask pattern information and an electrical energy signal for supplying power to the mask pattern generation device.

Preferably, the mask pattern generation device comprises: a Radio Frequency (RF) module configured to read the RFID signal transmitted from the RFID controller; an energy storage module configured to store the electrical energy signal in the RFID signal; an information processing module configured to parse the mask pattern information in the RFID signal into a mask pattern data; a storage module configured to store and update a mask pattern corresponding to the mask pattern data; and a display module configured to display the mask pattern updated by the storage module.

Preferably, the mask pattern data is a binary, octal or hexadecimal value.

Preferably, the energy storage module stores electrical energy required for updating the mask pattern displayed by the display module.

Preferably, the energy storage module is further configured to supply power to the information processing module, the storage module and the display module with the electrical energy signal.

Preferably, the display module is an e-ink screen.

According to another aspect of the present disclosure, an intelligent exposure system is provided. The intelligent exposure system comprises the mask pattern generation device according to the above first aspect.

According to yet another aspect of the present disclosure, a method for generating a mask pattern is provided. The method comprises: providing, by a mask pattern provision device, a mask pattern signal via a wired or wireless network; processing, by a mask pattern transmission device, the mask pattern signal provided by the mask pattern provision device to generate mask pattern information, and transmitting the generated mask pattern information over a Radio Frequency Identification (RFID) signal; and generating, by a mask pattern generation device, a mask pattern corresponding to the mask pattern information based on the mask pattern information and displaying the generated mask pattern.

The embodiments of the present disclosure allow interaction between the mask pattern provision device (a local PC or a mobile device) and the mask pattern generation device by utilizing IoT technique, such that the mask pattern generation device can display various different mask patterns on an e-ink screen, thereby providing a fast, convenient and low cost exposure scheme. In this way, it is possible to solve the problem that a mask pattern generation device in an exposure system needs to store a large number of mask patterns, it takes a long time for engineers to confirm the masks each time they are used for production, and during production, the exposure system needs to retrieve different masks frequently, which causes a great waste in labor, power and time.

BRIEF DESCRIPTION OF THE DRAWINGS

The above and other objects, features and advantages will become more apparent with reference to the embodiments of the present disclosure taken in conjunction with the figures, in which.

DETAILED DESCRIPTION OF THE EMBODIMENTS

In the following, the embodiments of the present disclosure will be described in further detail with reference to the embodiments and figures, such that the objects, solutions and advantages of the present disclosure will become more apparent. Obviously, the embodiments described below are only some, rather than all, of the embodiments. Starting from the embodiments of the present disclosure, those skilled in the art can obtain other embodiments without any inventive efforts. All these embodiments are to be encompassed by the scope of the present disclosure.

Figure 1:
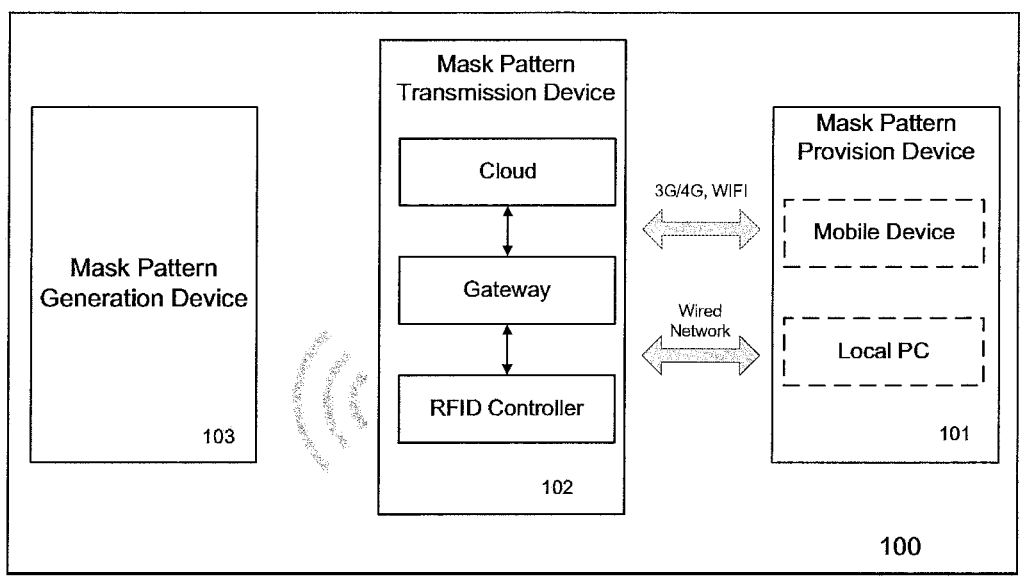
FIG. 1 is a block diagram of a system for generating a mask pattern according to an embodiment of the present disclosure.

FIG. 1 is a block diagram of a system 100 for generating a mask pattern according to an embodiment of the present disclosure. As shown in FIG. 1, the system 100 according to the embodiment of the present disclosure can include a mask pattern provision device 101, a mask pattern transmission device 102 and a mask pattern generation device 103.

Figure 3A:
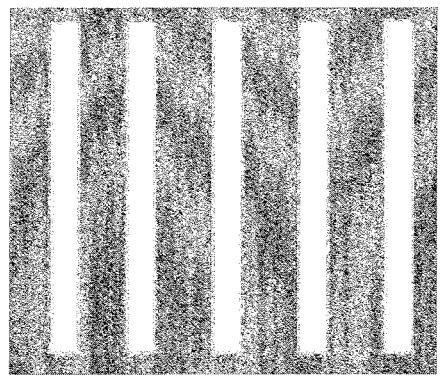
FIGS. 3A-3C are schematic diagrams each showing an example of mask pattern generated by a mask pattern generation device according to an embodiment of the present disclosure.
Figure 3B:
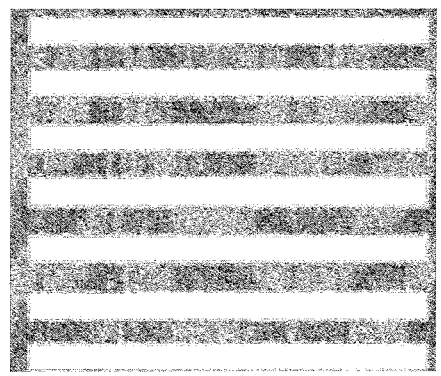
Figure 3C:
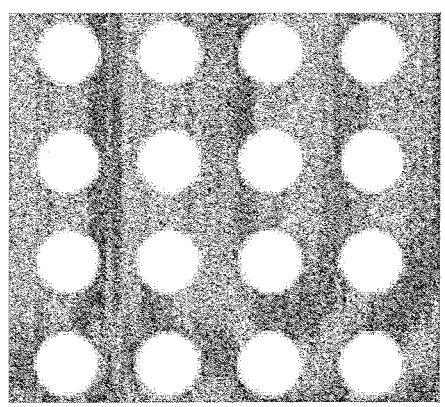

The mask pattern provision device 101 is configured to provide a mask pattern signal via a wired or wireless network. In an exemplary embodiment, the mask pattern provision device can be a local Personal Computer (PC), such as a tablet PC, a desktop PC, a laptop PC, a netbook, etc., or a mobile device, such as a mobile phone, a smart phone, a video phone, an e-book reader, a Personal Digital Assistant (PDA), etc. A user or engineer can download and store a large number of different mask patterns in the mask pattern provision device 101, and transmit these mask patterns in form of electrical signals via a wired or wireless network. In a semiconductor manufacture process, mask pattern information is transferred to semiconductor substrates through an exposure process, so as to produce various different semiconductor products. FIGS. 3A-3C show several examples of mask patterns. For example, a mask pattern may include vertical strips, horizontal strips, oblique strips, circle matrices, etc. It can be appreciated that the mask pattern is not limited to the above exemplary patterns.

In an exemplary embodiment, the wired network can be, but not limited to, Internet, a Local Area Network (LAN), a Wide Area Network (WAN), a telecommunication network or the like. The wireless network can be, but not limited to, a short-range wireless communication network, e.g., a Wi-Fi direct connection network, Wi-Fi network, Bluetooth network, Near Field Communication (NFC) network, Device to Device (DTD) network, etc., a cellular network or a satellite network, e.g., a 3G/4G/Long Term Evolution (LTE) network.

The mask pattern transmission device 102 is configured to process the mask pattern signal provided by the mask pattern provision device 101 to generate mask pattern information, and to transmit the generated mask pattern information over a Radio Frequency Identification (RFID) signal. With the IoT technique, the mask pattern transmission device 102 can process a large number of mask pattern signals by accessing a cloud or gateway, and can supply power and transmit information wirelessly with the RFID technique. A cloud is a software platform, by which the user can process (including filtering, enhancing, sharpening, binarizing, etc.) the mask pattern signal to generate information on the mask pattern without downloading and installing various processing software.

In an exemplary embodiment, the mask pattern transmission device 102 includes: a cloud and/or gateway configured to process the mask pattern signal provided by the mask pattern provision device 101; and an RFID controller configured to transmit the RFID signal to the mask pattern generation device 103, so as to supply power and transmit the mask pattern information to the mask pattern generation device 103. In particular, the RFID signal includes the mask pattern information and an electrical energy signal for supplying power to the mask pattern generation device 103. In this way, the mask pattern transmission device 102 implements both the power supply function and the information transmission function. Hence, the mask pattern generation device 103 operates only when the mask pattern transmission device 102 is providing the RFID signal, thereby providing a fast, convenient and low cost mask pattern generation scheme.

The mask pattern generation device 103 is configured to generate a mask pattern corresponding to the mask pattern information based on the mask pattern information transmitted from the mask pattern transmission device 102 and display the generated mask pattern.

In this exemplary embodiment, interaction between the mask pattern provision device 101 (a local PC or a mobile device) and the mask pattern generation device 103 is provided by utilizing IoT technique, such that various mask patterns can be displayed. Further, the processing of a large amount of data is achieved by access a cloud or gateway, and the wireless power supply (i.e., from the RFID controller) and information transmission are achieved by utilizing RFID technique. In this way, the power consumption and the cost can be reduced and a great waste in labor, power and time can be avoided.

Figure 2:
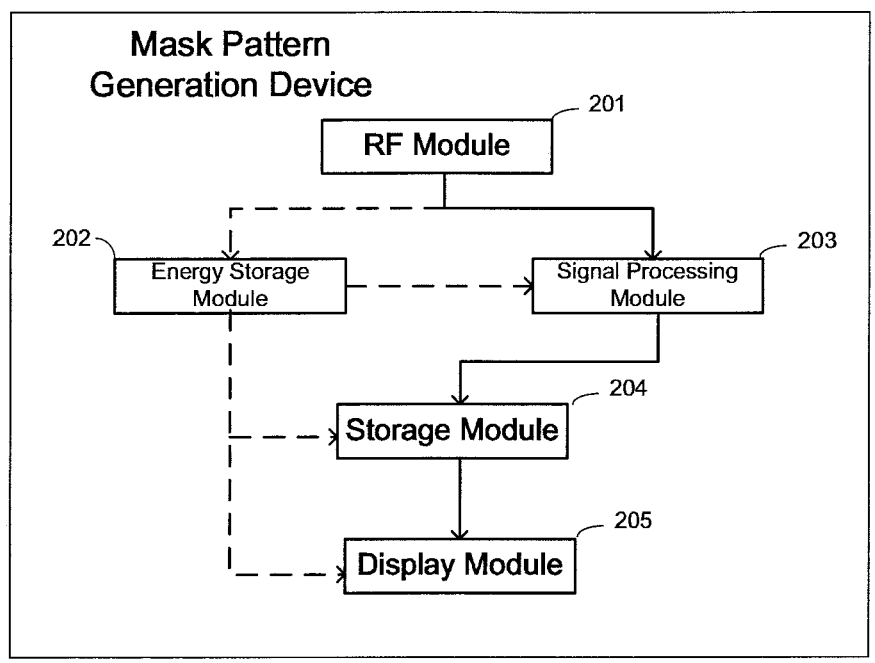
FIG. 2 is a block diagram of a mask pattern generation device according to an embodiment of the present disclosure.

FIG. 2 is a block diagram of a mask pattern generation device 103 according to an embodiment of the present disclosure. The mask pattern generation device 103 includes a Radio Frequency (RF) module 201, an energy storage module 202, an information processing module 203, a storage module 204 and a display module 205.

The RF module 201 is configured to read the RFID signal, e.g., an electromagnetic wave signal, transmitted from the RFID controller, and then transmit the electrical energy signal and the pattern information in the RFID signal to the energy storage module 202 and the information processing module 203.

The energy storage module 202 is configured to convert a portion of the RFID signal that is used for supplying power to the mask pattern generation device 103 into an electrical energy signal, store it temporarily, and supply power to the information processing module 203, the storage module 204 and the display module 205 with the electrical energy signal. In an exemplary embodiment, the energy storage module 202 may have a form of coil, e.g., it can be a super capacitor. Hence, the mask pattern generation device 103 itself may not be equipped with any power source and can be powered with the RFID signal transmitted from the RFID controller. Accordingly, the mask pattern generation device 103 does not operate when there is no need to update the mask pattern. In this way, the power consumption of the device itself can be reduced and the cost of the device can be reduced since no dedicated power source is required.

The information processing module 203 is configured to parse the mask pattern information in the RFID signal into a mask pattern data. In an exemplary embodiment, the mask pattern data can be, but not limited to, a binary, octal or hexadecimal value.

The storage module 204 is configured to store a mask pattern corresponding to the mask pattern data and update the previously stored common mask pattern, i.e., to update the mask pattern corresponding to the mask pattern data.

The display module 205 is configured to display the mask pattern updated by the storage module 204, upon detecting the update by the storage module 204. In an exemplary embodiment, the energy storage module 202 stores sufficient electrical energy required for updating the mask pattern displayed by the display module 205. In an exemplary embodiment, the display module 205 is an e-ink screen. An e-ink screen is a screen using e-ink, which is a new method and technique for displaying information. Like most of conventional ink, the e-ink and a route along which its color changes can be printed on various surfaces, e.g., curved plastic, polyester film, paper or cloth. Unlike conventional paper, the e-ink can have its color changed when powered on, and can display varying images. In accordance with the imaging principle of the above e-ink screen, when driven by the RFID controller and provided with the image signal from the local PC or mobile device, the e-ink screen can present transparent areas selectively to display the mask pattern and thus perform the exposure process. Further, the e-ink screen has a very low power consumption while displaying statically, and an energy consumption is required only when updating a picture.

The mask pattern transmission device according to this exemplary embodiment itself does not need to store a large number of mask patterns and uses external power and an e-ink screen having low power consumption. In this way, it is possible to achieve a fast, convenient and low cost exposure process.

Figure 4:
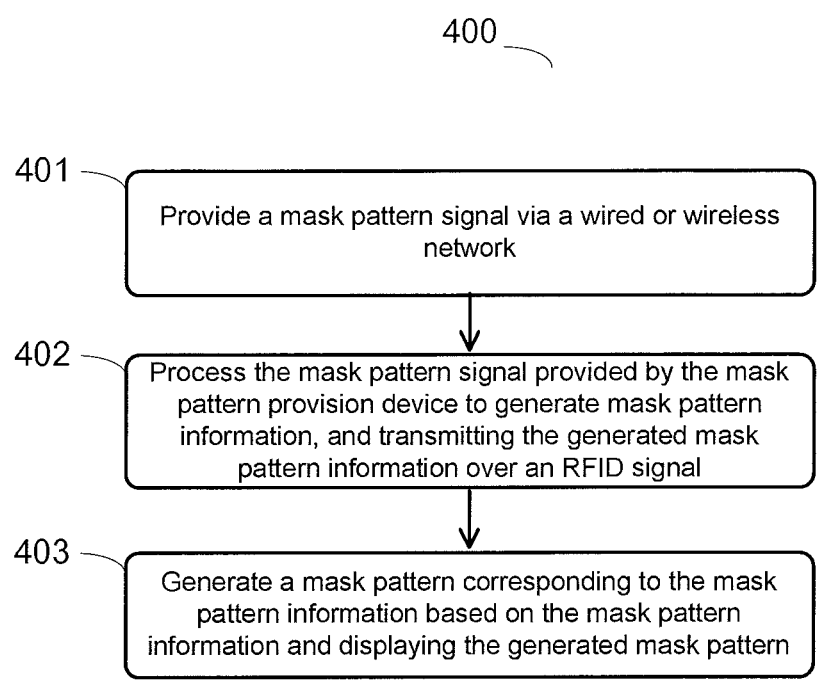
FIG. 4 is a flowchart illustrating a method for generating a mask pattern according to an embodiment of the present disclosure.

Next, a flowchart of a method 400 for generating a mask pattern according to an embodiment of the present disclosure will be described with reference to FIG. 4.

At step S401, a mask pattern provision device provides a mask pattern signal via a wired or wireless network.

At step S402, a mask pattern transmission device processes the mask pattern signal provided by the mask pattern provision device to generate mask pattern information, and transmits the generated mask pattern information over a Radio Frequency Identification (RFID) signal.

At step S403, a mask pattern generation device generates a mask pattern corresponding to the mask pattern information based on the mask pattern information and displays the generated mask pattern.

In this exemplary embodiment, interaction between the mask pattern provision device (a local PC or a mobile device) and the mask pattern generation device is provided by utilizing IoT technique, such that various mask patterns can be displayed. Further, the processing of a large amount of data is achieved by access a cloud or gateway, and the wireless power supply (i.e., from the RFID controller) and information transmission are achieved by utilizing RFID technique. In this way, the power consumption and the cost can be reduced and a great waste in labor, power and time can be avoided.

According to another embodiment of the present disclosure, an intelligent exposure system is provided. The intelligent exposure system includes the mask pattern generation device as described in the above embodiments. The intelligent exposure system exposes substrates coated with photoresists with the mask patterns generated by the mask pattern generation device, so as to produce semiconductor substrates having different patterns. In this embodiment, the intelligent exposure system can interact with the mask pattern provision device (a local PC or a mobile device) via IoT. Hence, when exposing different substrates, a large number of mask patterns can be retrieved by utilizing the RFID, without the need to store these mask patterns within the intelligent exposure system. It is thus possible to solve the problem that a conventional exposure system requires engineers in the field to frequently retrieve and confirm different mask patterns stored in the exposure system, which causes a great waste in labor, power and time.

It is to be noted here that the scope of the subject matter of the present disclosure is not limited to the embodiments described above. For example, some embodiments can be implemented in hardware, for operating on a device or a combination of devices, while other embodiments can be implemented in software and/or firmware. Similarly, some embodiments can include one or more articles, e.g., storage media or storage medium, although the scope of the subject matter is not limited thereto. The storage medium, e.g., a CD-ROM, a computer disk, a flash memory, etc., may have instructions stored thereon, which, when executed by a system (e.g., a computer system, a computing platform or another system), cause a processor to implement the subject matter, e.g., one of the above embodiments. In one possible implementation, a computing platform can include one or more processing units or processors, one or more input/output devices (e.g., a display, keyboard and/or mouse) and one or more memories (e.g., a Static Random Access Memory (SRAM), a Dynamic Random Access Memory (DRAM), a flash memory and/or a hard drive).

What is claimed is:

1. A system for generating a mask pattern, comprising:
   a mask pattern provision device configured to provide a mask pattern signal via a wired or wireless network;
   a mask pattern transmission device configured to process the mask pattern signal provided by the mask pattern provision device to generate mask pattern information, and to transmit the generated mask pattern information over a Radio Frequency Identification (RFID) signal; and
   a mask pattern generation device configured to generate a mask pattern corresponding to the mask pattern information based on the mask pattern information and displaying the generated mask pattern;

wherein the mask pattern transmission device comprises:
an RFID controller configured to transmit the RFID signal to the mask pattern generation device, so as to supply power and transmit the mask pattern information to the mask pattern generation device,
wherein the RFID signal comprises the mask pattern information and an electrical energy signal for supplying power to the mask pattern generation device.

2. The system of claim 1, wherein the mask pattern provision device is a local Personal Computer (PC) or a mobile device.

3. The system of claim 1, wherein the wired network is at least one of Internet, a Local Area Network (LAN), a Wide Area Network (WAN) and a telecommunication network.

4. The system of claim 1, wherein the wireless network is at least one of 3G network, 4G network, Long Term Evolution (LTE) network, Wi-Fi network, Bluetooth network and Near Field Communication (NFC) network.

5. The system of claim 1, wherein the mask pattern transmission device further comprises:
a cloud and/or gateway configured to process the mask pattern signal provided by the mask pattern provision device.

6. The system of claim 1, wherein the mask pattern generation device comprises:
a Radio Frequency (RF) module configured to read the RFID signal transmitted from the RFID controller;
an energy storage module configured to store the electrical energy signal in the RFID signal;
an information processing module configured to parse the mask pattern information in the RFID signal into a mask pattern data;
a storage module configured to store and update a mask pattern corresponding to the mask pattern data; and
a display module configured to display the mask pattern updated by the storage module.

7. The system of claim 6, wherein the mask pattern data is a binary, octal or hexadecimal value.

8. The system of claim 6, wherein the energy storage module stores electrical energy required for updating the mask pattern displayed by the display module.

9. The system of claim 6, wherein the energy storage module is further configured to supply power to the information processing module, the storage module and the display module with the electrical energy signal.

10. The system of claim 6, wherein the display module is an e-ink screen.

11. A method for generating a mask pattern, comprising:
providing, by a mask pattern provision device, a mask pattern signal via a wired or wireless network;
processing, by a mask pattern transmission device, the mask pattern signal provided by the mask pattern provision device to generate mask pattern information;
transmitting, by the mask pattern transmission device, the generated mask pattern information over a Radio Frequency Identification (RFID) signal to the mask pattern generation device; and
generating, by a mask pattern generation device, a mask pattern corresponding to the mask pattern information based on the mask pattern information and displaying the generated mask pattern;
wherein the RFID signal comprises the mask pattern information and an electrical energy signal for supplying power to the mask pattern generation device.

* * * * *